United States Patent [19]

Kim

[11] Patent Number: 5,547,883

[45] Date of Patent: Aug. 20, 1996

[54] METHOD FOR FABRICATING THIN FILM TRANSISTOR

[75] Inventor: In Kim, Seoul, Rep. of Korea

[73] Assignee: Lg Semicon Co., Ltd., Chungcheongbuk-do, Rep. of Korea

[21] Appl. No.: 504,688

[22] Filed: Jul. 20, 1995

[30] Foreign Application Priority Data

Jul. 21, 1994 [KR] Rep. of Korea .................. 17688/1994

[51] Int. Cl.$^6$ .................................................. H01L 21/86
[52] U.S. Cl. .................. 437/40; 437/21; 437/35; 148/DIG. 150
[58] Field of Search ................ 437/40 TFI, 41 TFI, 437/21, 34, 35, 915, 48, 52, 44, 56, 400 TFT, 41 TFT; 148/DIG. 150

[56] References Cited

U.S. PATENT DOCUMENTS

| | | | |
|---|---|---|---|
| 5,019,525 | 5/1991 | Virkus et al. | 148/DIG. 150 |
| 5,039,621 | 8/1991 | Pollack | 437/21 |
| 5,158,901 | 10/1991 | Kosa et al. | 437/35 |
| 5,177,661 | 1/1993 | Zavracky et al. | 437/51 |
| 5,214,295 | 5/1993 | Manning | 437/44 |
| 5,283,455 | 2/1994 | Inoue et al. | 257/329 |
| 5,334,862 | 8/1994 | Manning et al. | 437/40 TFT |
| 5,403,761 | 4/1995 | Rha | 437/TFI |

FOREIGN PATENT DOCUMENTS 5299435  11/1993  Japan ................. 437/40 TFT

*Primary Examiner*—Tom Thomas
*Assistant Examiner*—Michael Trinh
*Attorney, Agent, or Firm*—Finnegan, Henderson, Farabow, Garrett & Dunner, L.L.P.

[57] ABSTRACT

A thin film transistor having increased channel length and self-aligned source and drain regions is fabricated by forming a gate electrode on an insulation film disposed on a substrate. Portions of the insulation film are then etched on opposite sides of the gate electrode, as well as beneath part of the gate electrode. A gate insulation film is then formed on the entire exposed surface of the gate electrode, and a semiconductor layer is then formed on the entire gate insulation film, as well as portions of the insulation film. Doping impurities may then be implanted at an angle other than 90° to the surface of the substrate to achieve a thin film transistor having an extended channel length but occupying a relatively small area on the surface of the substrate.

13 Claims, 6 Drawing Sheets

5,547,883

1

METHOD FOR FABRICATING THIN FILM TRANSISTOR

BACKGROUND OF THE INVENTION

The present invention relates to a method for fabricating a thin film transistor, and more particularly to a method for fabricating a thin film transistor for incorporation into a highly integrated memory device.

DESCRIPTION OF THE PRIOR ART

FIGS. 1a–1d illustrate conventional process steps for fabricating a thin film transistor having a lightly doped drain (LDD) region.

As shown in FIG. 1a, a patterned polysilicon gate electrode 2 is first provided on substrate 1. Gate oxide film 3 and polysilicon body layer 4 are then successively deposited on gate electrode 2 and substrate 1. Channel impurities are then implanted into selected portions of polysilicon body 4.

As seen in FIG. 1b, a first photoresist layer 5 is patterned to expose portions of polysilicon body 4 corresponding to LDD regions. Impurities are then implanted into the exposed portions to form LDD regions 10.

As shown in FIG. 1c, photoresist layer 5 is removed and a second photoresist layer 6 is coated over the substrate and patterned to expose regions of polysilicon body 4 for formation of a source and a drain. Impurities are then implanted into the exposed regions of polysilicon body 4 to form source and drain regions 11. Photoresist layer 6 is then removed and the resulting thin film transistor is shown in FIG. 1d.

The conventional TFT fabricated in accordance with the above-described method requires a long channel length in order to obtain acceptable element characteristics, thereby making further integration of various memory circuits, such as static random access memories (SRAMs), more difficult. Moreover, since the LDD, source and drain regions are defined using separate masking steps, alignment errors can cause variations in the lengths of these regions, thereby adversely effecting element characteristics.

In light of the above problems, a TFT structure having spacers has been proposed. A conventional method for making this kind of device will now be described with reference to FIGS. 2a–2d.

As shown in FIG. 2a, a patterned gate electrode 2 is provided on substrate 1. Gate oxide film 3 and body layer 4 are successively deposited over the entire substrate surface and on gate electrode 2. Next, as seen in FIG. 2b, a thick oxide implantation mask 5 is provided on a portion of polysilicon body 4 overlying gate electrode 2. Thick oxide mask 5 is formed by providing a thick oxide layer on polysilicon body 4 and removing selected portions of the oxide in accordance with a predetermined pattern. Impurities are then implanted at a low dosage into portions of the polysilicon body 4 not covered by thick oxide mask 5, thereby forming LDD regions in polysilicon body 4.

As seen in FIG. 2c, spacers 6 are provided on opposite sides of gate electrode 2 and thick oxide mask 5. The spacers are formed by depositing an oxide film over the entire substrate surface and then subjecting the film to an etch back process. High dosage source and drain implants are then performed, after which the spacer and thick oxide mask are removed. The resulting TFT as shown in 2d is thus obtained. This device is said to have a "self-aligned" structure.

2

The conventional process used to fabricate a self-aligned TFT minimizes the number of mask steps required to fabricate the TFT. However, additional etching steps are necessary. For example, three times as many etching steps are required compared to the process shown in FIGS. 1a–1d. The additional etching steps make it difficult to achieve reproducible sidewall lengths, thereby making it difficult to obtain reproducible LDD lengths.

SUMMARY OF THE INVENTION

The object of the present invention is to provide a method for fabricating a thin film transistor which is suitable for increased integration density.

These and other objects and features of the present invention can be achieved by providing a method for fabricating a thin film transistor including the steps of first forming an insulative film on a surface of a substrate. Then, in a subsequent step, forming a gate electrode on said insulative film having first and second side surfaces, a top surface and a bottom surface. A first portion of the insulative film-adjacent the first side surface of the gate electrode and a second portion of the gate electrode adjacent the second side surface of the gate electrode are then etched. A gate insulation film is then formed over the top surface and the first and second side surfaces of the gate electrode. A semiconductor layer is formed on portions of the gate insulation film over the top surface and the first and second side surfaces of the gate electrode; impurities are then implanted into said semiconductor layer along a first direction which forms an angle other than 90 degrees with a second direction running parallel to the surface of said substrate.

DETAILED DESCRIPTION OF THE PREFERRED EMBODIMENTS

Figure 1A:
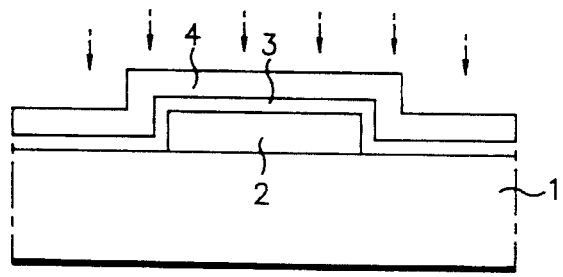
FIGS. 1a–1d illustrate conventional process steps for fabricating a thin film transistor having an LDD structure.
Figure 1B:
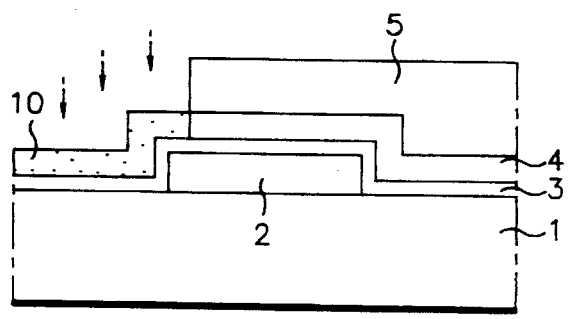
Figure 1C:
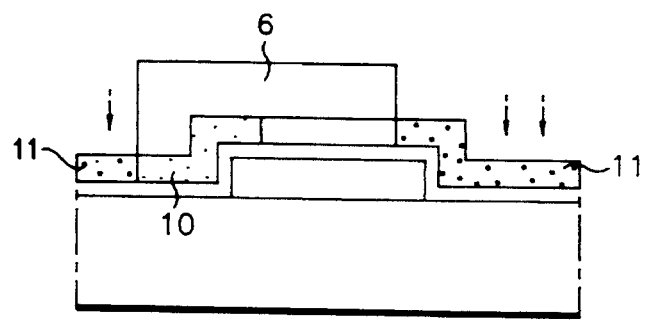
Figure 1D:
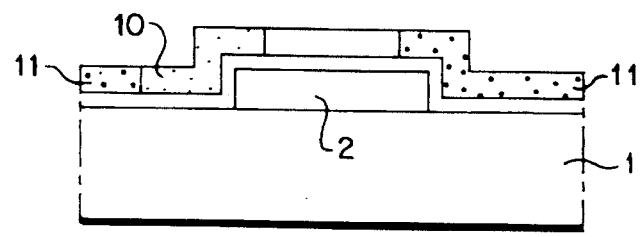
Figure 2A:
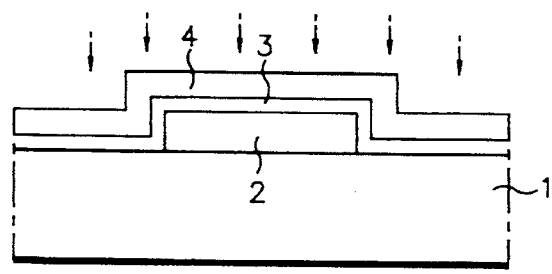
FIGS. 2a–2d illustrate conventional process steps for fabricating a thin film transistor having a self-aligned LDD structure.
Figure 2B:
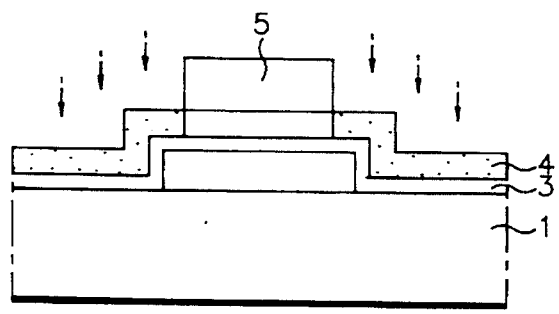
Figure 2C:
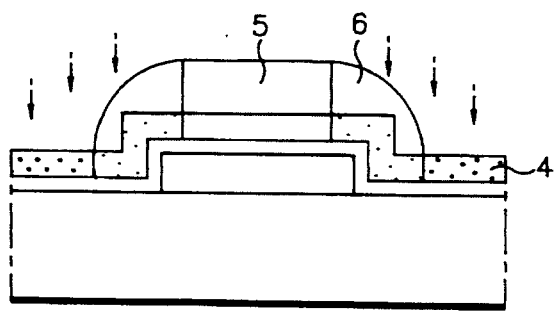
Figure 2D:
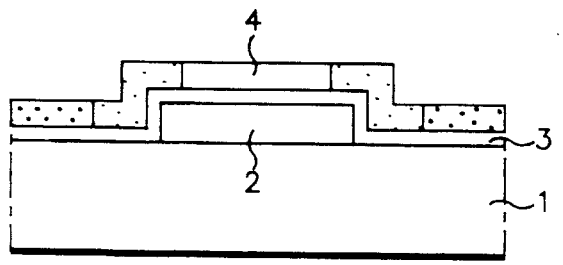
Figure 3A:
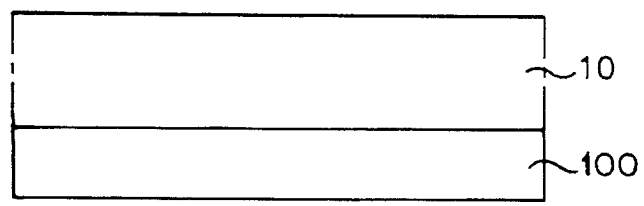
FIGS. 3a–3g illustrate a method for fabricating a thin film transistor in accordance with a first embodiment of the present invention.

FIGS. 3a–3g illustrate a process for fabricating a TFT in accordance with a first embodiment of the present invention. As shown in FIG. 3a, an insulative oxide film 10 is formed on a substrate 100. Preferably, the substrate includes bulk MOSFETs formed on its surface.

Figure 3B:
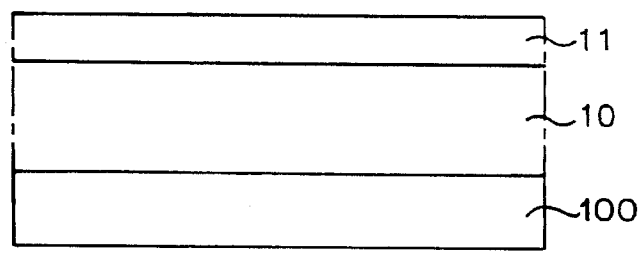
Figure 3C:
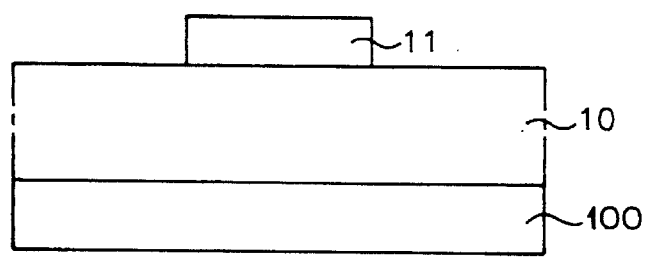

Next, as shown in FIG. 3b, a conductive polysilicon layer 11 is deposited on oxide film 10 to a thickness of about 1000 Å. Then, in FIG. 3c, polysilicon layer 11 is patterned to form a gate electrode 11.

Figure 3D:
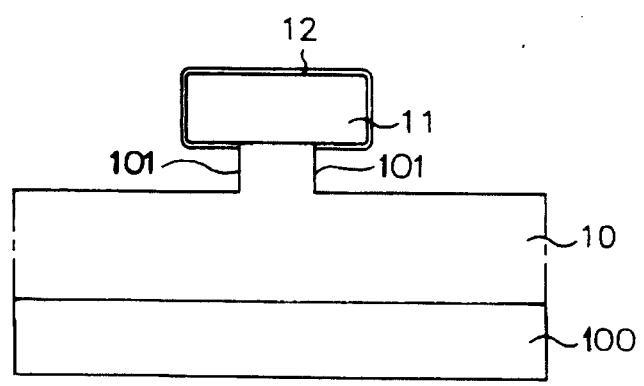

In the step shown in FIG. 3d, oxide film 10 is first subjected to a dry etch, and then to a wet etch. During the wet etch, the polysilicon gate 11 serves as a mask, thereby causing the undercut 101 shown in FIG. 3d. A gate oxide film 12 is then formed to a thickness of approximately 400 Å over the entire exposed surface of polysilicon gate electrode 11.

Figure 3E:
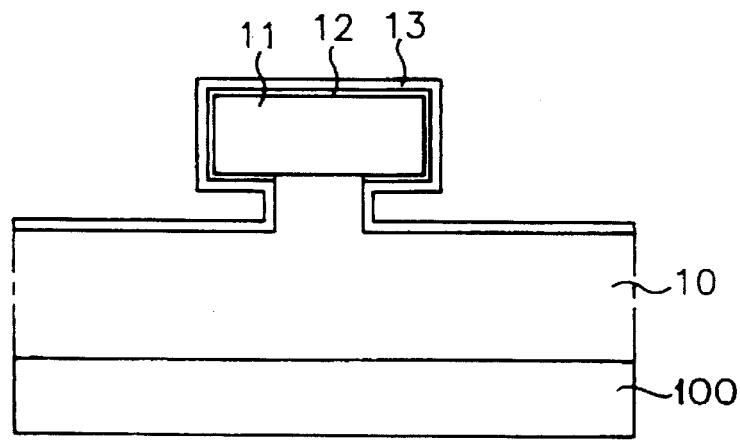
Figure 3F:
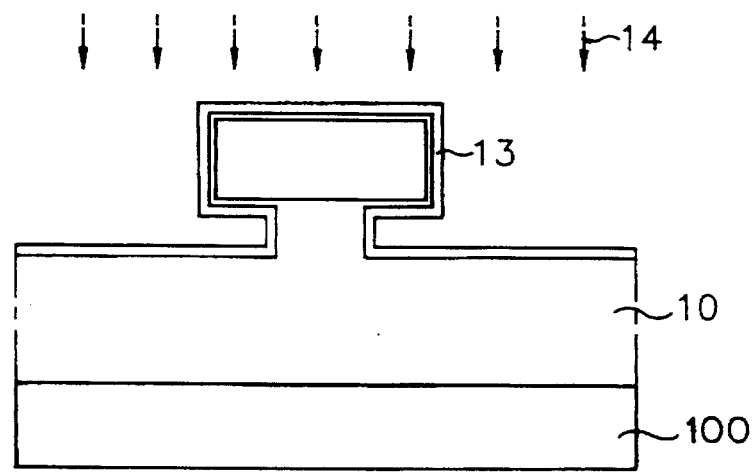

In FIG. 3e, a silicon body layer 13 is formed to a thickness of approximately 600 Å on exposed surfaces of oxide film 10 and on the entire gate oxide film 12. Then channel ions 14 are implanted, as shown in FIG. 3f. Portions of silicon body 13 in the undercut portion of gate 11 are shaded from the implant and are not doped in this step. These portions will form offset regions in the completed device. If the density of silicon body layer 13 is sufficiently controlled, the above-described implantation step can be omitted.

Figure 3G:
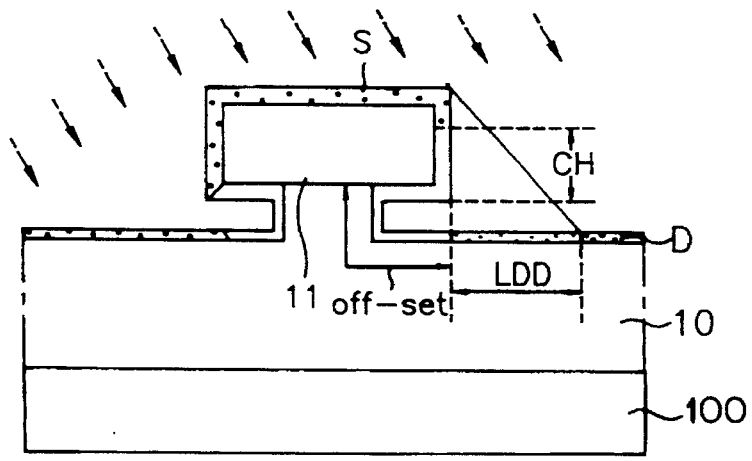

As shown in FIG. 3g, the source/drain implant is carried out preferably by angling the direction of implantation so that the ions impinge at an angle other than 90°. That is, the direction at which ions are implanted forms an angle other than 90° with a direction parallel to the surface of substrate 100. As a result, heavily doped source and drain regions, S and D, respectively, are formed as shown in FIG. 3g. Further, channel region CH and lightly doped drain region LDD are also provided with an offset region OFFSET disposed therebetween. Alternatively, after the channel implant, a low dose ion implant may be performed to provide a lightly doped offset (LDO) structure in the device shown in FIG. 3g.

Figure 4A:
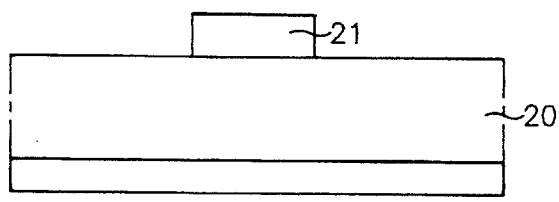
FIGS. 4a–4f illustrate process steps for fabricating a thin film transistor in accordance with a second embodiment of the present invention.

A second embodiment of the present invention will now be described with reference to FIGS. 4a–4f. As shown in FIG. 4a, a patterned gate electrode 21 is formed on the surface of a first insulative oxide film 20, which is disposed on substrate 100.

Figure 4B:
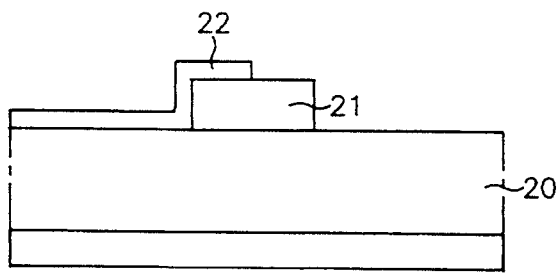
Figure 4C:
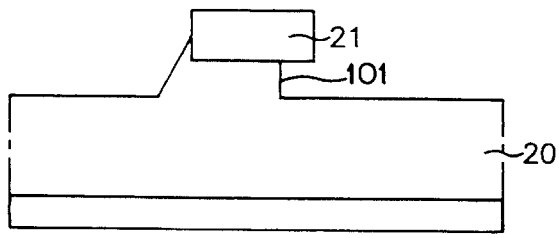

A second oxide film 22 is then formed on the entire surface of the first oxide film and on exposed surfaces of the gate electrode 21. As seen in FIG. 4b, the second oxide film 22 is selectively etched so that the remaining portions overly one side of the gate corresponding to the source side in the completed device. Next, as shown in FIG. 4c, oxide films 20 and 22 are etched to a predetermined thickness using a wet etch. The resulting structure has an undercut 101 on the side of gate electrode 21 devoid of oxide film 22 and a sloped portion on the other side of gate electrode 21 where the oxide was thick.

Figure 4D:
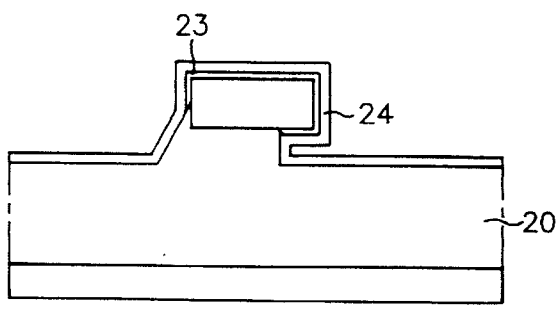

In the step shown in FIG. 4d, a gate oxide film 23 is provided on the exposed surfaces of gate electrode 21, and a semiconductor layer 24 is formed both on gate oxide film 23 and exposed portions of oxide film 20.

Figure 4E:
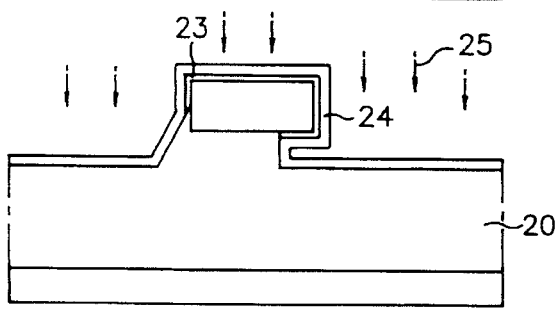

As seen in FIG. 4e, a channel or a low concentration ion implant may then be carried out. In the case where a low concentration or dosage of ions are implanted, an LDD structure can be obtained. In which case, a portion of semiconductor layer 24 is shaded from the impinging ions and is not doped during the implant. This portion of semiconductor layer 24 will become an offset region in the final device structure.

Figure 4F:
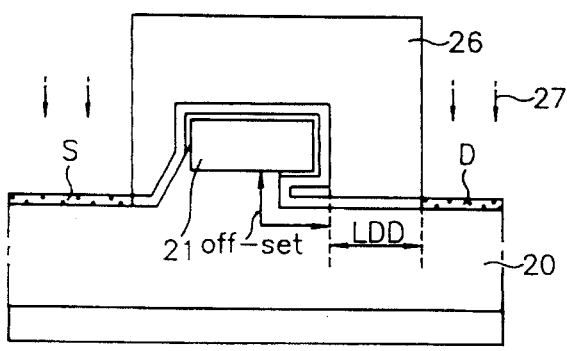

Next, as shown in FIG. 4f, a patterned photoresist layer 26 is provided which defines source and drain regions in semiconductor layer 24. A source/drain implant is then performed using photoresist layer 26 as an implantation mask. As a result, the completed TFT shown in FIG. 4F includes source (S), Drain (D), offset (OFF-SET) and LDD regions shown in FIG. 4f.

A third embodiment of the present invention will now be described with reference to FIGS. 5a–5c.

Figure 5A:
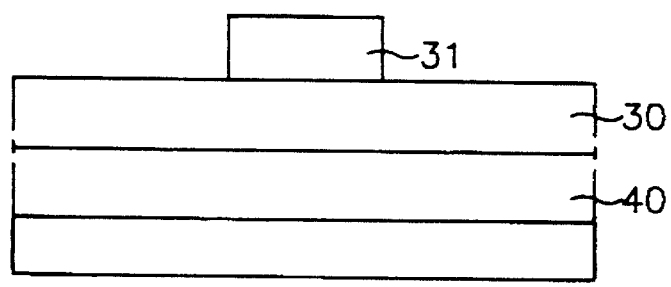
FIG. 5a–5c illustrate process steps for fabricating a thin film transistor in accordance with a third embodiment of the present invention.

First, as shown in FIG. 5a, an etching prevention layer 40, preferably including a nitride film, is provided on substrate 100. An oxide film 30 and a patterned gate electrode 31 are then successively formed on oxide etching prevention layer 40.

Figure 5B:
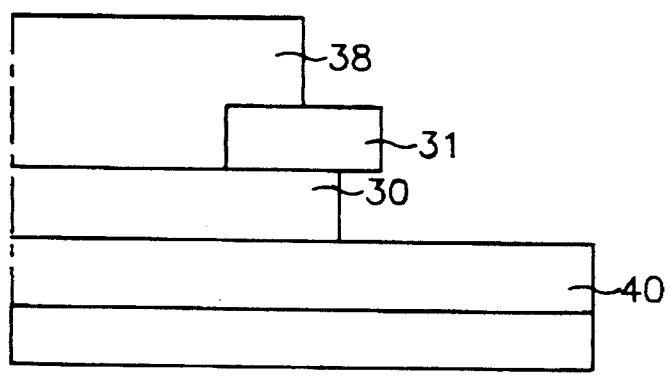

Next, as seen in FIG. 5b, a photoresist layer 38 is preferably coated on gate electrode 31 and oxide film 30. Photoresist layer 38 is then preferably exposed in a predetermined pattern and developed to remove selected portions. Photoresist layer 38 is thus patterned as shown in FIG. 5b to cover one side of gate electrode 31. Oxide film 30 is then subjected to a wet etch using patterned photoresist 38 as a mask. The resulting structure includes an undercut 101 in portions of oxide film 30 adjacent gate 31 and not covered by photoresist 38.

Figure 5C:
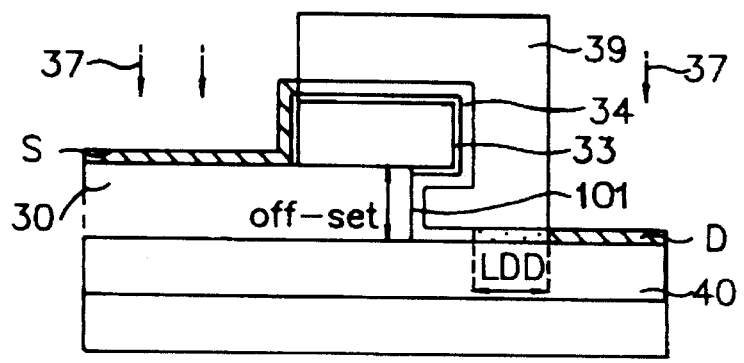

In the step shown in FIG. 5c, photoresist pattern 38 is removed and a gate oxide film 33 is formed on exposed portions of gate electrode 31. A semiconductor layer 34 is then provided on gate oxide 33, exposed portions of oxide film 30, and etching prevention layer 40. A channel or low concentration (dosage) (i.e., LDD forming) implant is then carried out. During the implant, a portion of semiconductor layer 34 is shaded from the imping ions and remains undoped during this step. The shaded portion thus becomes an offset region in the final device.

As further shown in FIG. 5c, source and drain regions S and D, respectively, are formed by implanting ions into portions of semiconductor layer 34 using patterned photoresist layer 39 as an implantation mask. The resulting device structure includes an LDD, region as well as source region S, drain region D, and offset region OFFSET.

The thin film transistor fabricated in accordance with the present invention have increased channel lengths without significantly increasing the gate area. Further, the TFTs in accordance with the present invention are fabricated using a simplified process in which an LDD structure and source/drain regions result from a single wet etch and do not require additional mask steps. A suitable process margin can further be achieved because a reproducible LDO structure is formed by a self-aligned process.

Other embodiments of the invention will be apparent to those skilled in the art from consideration of the specification and practice of the invention disclosed herein. It is intended that the specification and disclosed embodiments be considered as exemplary only, with a true scope and spirit of the invention being indicated by the following claims.

What is claimed is:

1. A method for fabricating a thin film transistor comprising the steps of:

forming an insulative film on a surface of a substrate;

forming a gate electrode on said insulative film, said gate electrode having first and second side surfaces, a top surface and a bottom surface;

etching a first portion of said insulative film adjacent said first side surface of said gate electrode, etching a second portion of said insulative film adjacent said second side surface of said gate electrode, and etching a third portion of said insulative film adjacent a portion of said bottom surface and said first side surface of said gate electrode;

forming a gate insulation film over said top surface, said first and second side surfaces of said gate electrode, and said portion of said bottom surface of said gate electrode;

forming a semiconductor layer on portions of said gate insulation film over said top surface, said first and second side surfaces of said gate electrode, and said potion of said bottom surface Of said .gate electrode; and implanting a group of impurities into said semiconductor layer along a first direction which forms an angle other than 90 degrees with a second direction running parallel to said surface of said substrate.

2. A method for fabricating a thin film transistor in accordance with claim 1, wherein, said steps of etching said first, second, and third portions of said insulative film include subjecting said insulative film to a dry etch followed by a wet etch using said gate electrode as a mask during said dry and wet etches.

3. A method for fabricating a thin film transistor in accordance with claim 1, wherein said step of etching said first, second and third portions of said insulative film includes etching a further portion of said insulative film to expose said portion of said bottom surface of said gate electrode while leaving a covered portion of said bottom surface of said gate electrode covered by a fourth portion of said insulative film such that, during said step of forming said semiconductor layer, a portion of said semiconductor layer is formed on said fourth portion of said insulative film, and, during said step of implanting said group of impurities, said portion of said semiconductor layer formed on said fourth portion of said insulative film is shaded from said implanted group of impurities by said gate electrode to form an offset region therein while forming source and drain regions in portions of said semiconductor layer exposed to said implanted group of impurities.

4. A method for fabricating a thin film transistor in accordance with claim 1, wherein a region of said semiconductor layer is provided adjacent said portion of said bottom surface of said gate electrode, and an offset region is formed in a region of said semiconductor layer adjacent said bottom surface of said gate electrode.

5. A method for fabricating a thin film transistor in accordance with claim 3, wherein said group of impurities are implanted at a first dosage, said method further comprising the step of:

implanting another group of impurities at a second dosage, said second dosage being less than said first dosage, said another group of impurities are implanted subsequent to said step of forming said semiconductor layer.

6. A method for fabricating a thin film transistor in accordance with claim 5, wherein said step of implanting said another group of impurities forms a lightly doped drain region in a portion of said semiconductor layer between said offset region and said drain region.

7. A method for fabricating a thin film transistor comprising the steps of:

forming an insulation film on a substrate surface;

forming a gate electrode on the insulation film, said gate electrode having a first side surface, a second side surface, a top surface and a bottom surface;

etching a portion of the insulation film beneath said first side surface to expose a portion of said bottom surface of said gate electrode;

forming a gate insulation film on said first and second side surfaces, said top surface, and said portion of said bottom surface of said gate electrode;

forming a semiconductor layer on all of said gate insulation film and said insulation film;

forming a mask layer over selected portions of the semiconductor layer, said mask layer exposing first and second portions of said semiconductor layer; and implanting a group of impurities into said first and second portions of said semiconductor layer to form source and drain regions, respectively, of said thin film transistor.

8. A method for fabricating a thin film transistor in accordance with claim 7, wherein the step of etching a portion of said insulation film beneath said first side surface of said gate electrode further comprises the steps of:

forming another insulation film on said insulation film and on said first and second side surfaces, said top surface, and said portion of said bottom surface of said gate electrode, said another insulation film including the same material as in said insulation film on said top surface of said gate electrode;

selectively etching said another insulation film to expose one side of said gate electrode; and etching said insulation film and said another insulation film with a wet etch.

9. A method for fabricating a thin film transistor in accordance with claim 8, wherein said insulation film and said another insulation film both include oxide films.

10. A method for fabricating a thin film transistor in accordance with claim 7, wherein said step of etching a portion of the insulation film beneath said first side surface further includes the steps of:

providing a photoresist layer on said gate electrode;

exposing said photoresist layer in a pattern;

developing said photoresist layer to selectively expose one side of said gate electrode and a portion of said insulation layer adjacent thereto; and subjecting said exposed portion of said insulation layer to a wet etch using said photoresist layer as a mask.

11. A method for fabricating a thin film transistor in accordance with claim 7, wherein, during said step of implanting said group of impurities, said bottom surface of said gate electrode is shaded from said implanted group of impurities to thereby form an offset region in a portion of said semiconductor layer adjacent said portion of the bottom surface of said gate electrode.

12. A method for fabricating a thin film transistor in accordance with claim 7, wherein said group of impurities are implanted at a first dosage, said method further comprising the step of:

implanting another group of impurities at a second dosage less than said first dosage, said step of implanting said another group of impurities is performed after said step of forming said semiconductor layer.

13. A method for fabricating a thin film transistor in accordance with claim 12, wherein a lightly doped drain region is formed in said semiconductor layer between the offset region and the drain region, said lightly doped drain region is formed by said step of implanting said another group of impurities.

* * * * *